United States Patent [19]
Gardner et al.

[11] Patent Number: 5,719,067
[45] Date of Patent: Feb. 17, 1998

[54] TRENCH TRANSISTOR AND METHOD FOR MAKING SAME

[75] Inventors: Mark I. Gardner, Cedar Creek; Fred N. Hause, Austin, both of Tex.

[73] Assignee: Advanced Micro Devices, Inc., Sunnyvale, Calif.

[21] Appl. No.: 709,378

[22] Filed: Sep. 6, 1996

[51] Int. Cl.$^6$ .............................................. H01L 21/266
[52] U.S. Cl. .................. 437/40; 437/44; 437/67; 437/203
[58] Field of Search .................. 437/38, 40 RG, 437/44, 67, 69, 203; 148/DIG. 50

[56] References Cited

U.S. PATENT DOCUMENTS

| | | | |
|---|---|---|---|
| 4,683,643 | 8/1987 | Nakajima et al. | 437/40 RG |
| 5,021,355 | 6/1991 | Dhong et al. | 437/44 |
| 5,180,680 | 1/1993 | Yang | 437/203 |
| 5,250,450 | 10/1993 | Lee et al. | 437/40 RG |

*Primary Examiner*—Chandra Chaudhari
*Attorney, Agent, or Firm*—Joseph P. Lally; Conley, Rose & Tayon

[57] ABSTRACT

A field effect transistor and method for making same in which a first source/drain impurity distribution is located at a first depth below an upper surface of the semiconductor substrate and a second source/drain impurity distribution is located at a second depth below the upper surface. In a presently preferred embodiment, the first depth is greater than the second depth such that the transistor includes a channel region having a vertical component. The channel region extends from the first source/drain impurity distribution to the second source/drain impurity distribution. The field effect transistor further includes a gate dielectric which is in contact with the channel region and a conductive gate structure in contact with the gate dielectric layer. The vertical component of the transistor channel length can be accurately controlled with plasma etch techniques. In this manner, the transistor channel length is not defined by a photolithography process and, therefore, dimensions smaller than the minimum feature size resolvable by a photolithography aligner can be achieved.

10 Claims, 2 Drawing Sheets

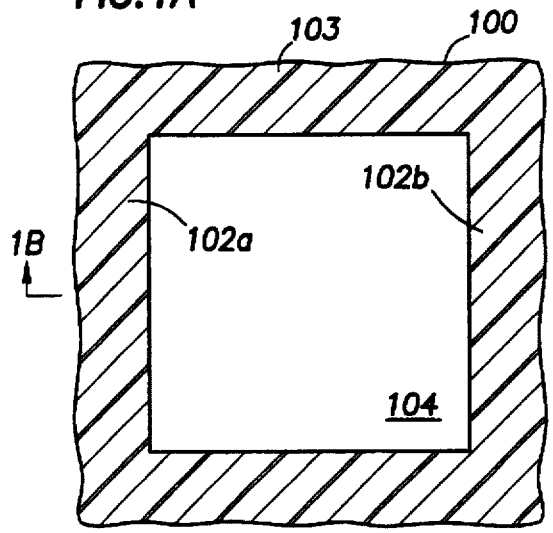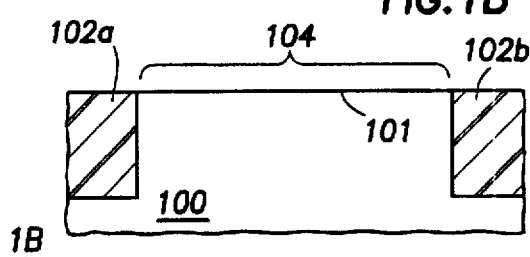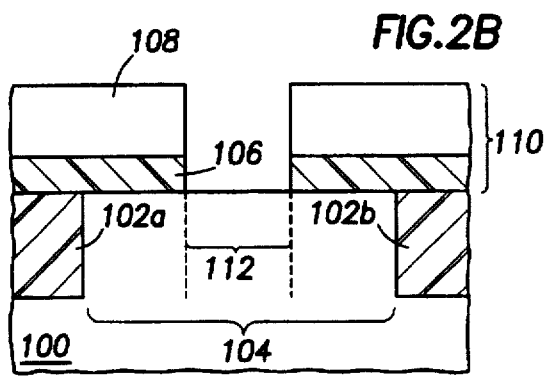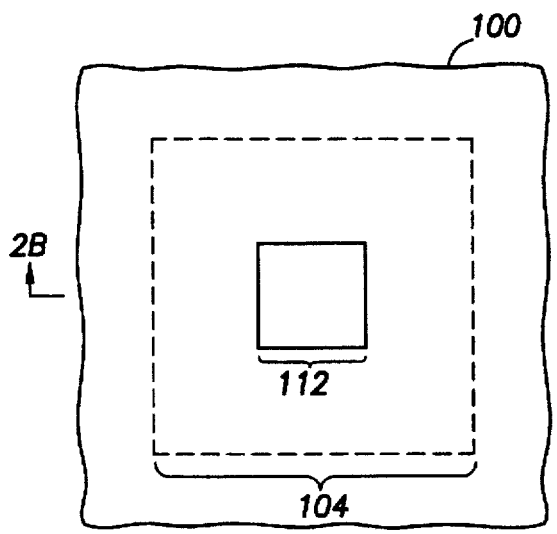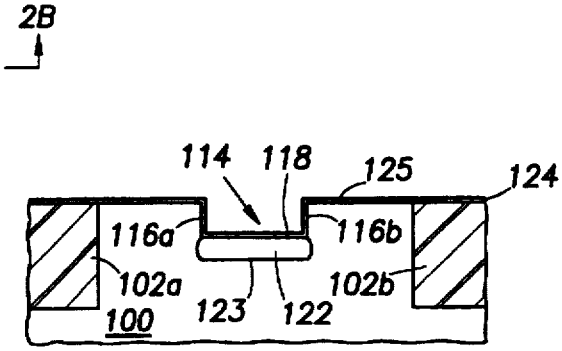

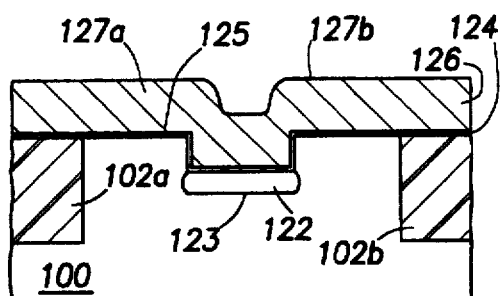
FIG. 5B
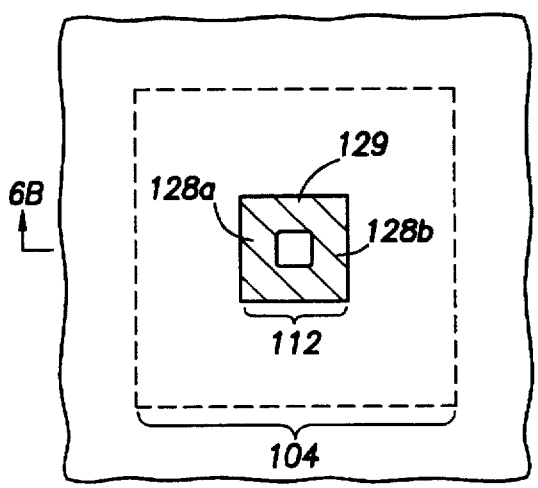
FIG. 6A1
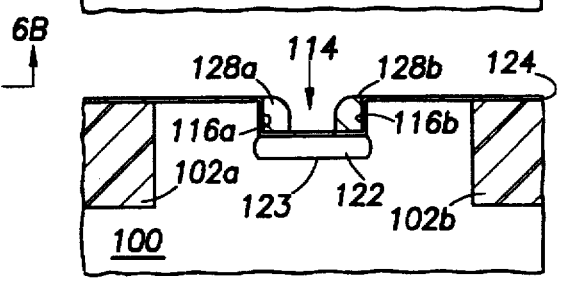
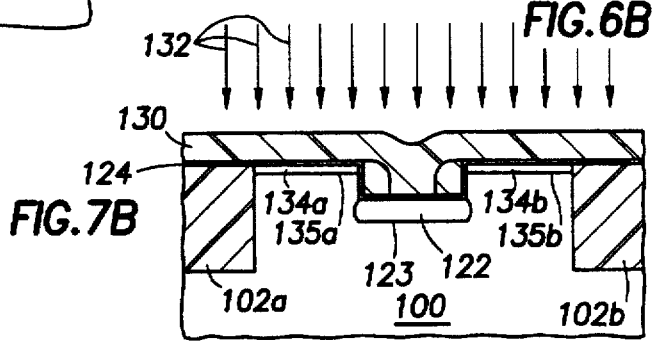
FIG. 6B
FIG. 7B
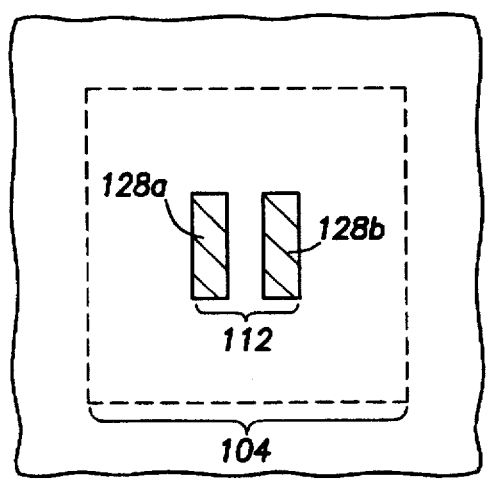
FIG. 6A2
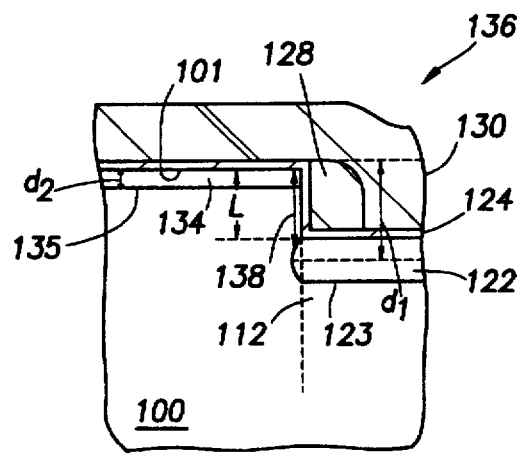
FIG. 8

TRENCH TRANSISTOR AND METHOD FOR MAKING SAME

BACKGROUND OF THE INVENTION

1. Field of the invention

This invention relates to the field of semiconductor processing and, more particularly, to a method of forming a field effect transistor in which a first source/drain region is formed below a second source/drain region such that the transistor channel has a vertical component.

2. Description of the Relevant Art

The operating characteristics of transistors fabricated with standard metal-oxide-semiconductor (MOS) integrated circuit techniques are a function of the transistor's dimensions. In particular, the source-to-drain current ($I_{ds}$) is proportional to the ratio of the transistor's width (W) to the transistor's length (L). For given transistor width and a given biasing condition (e.g. $V_G$=3V, $V_D$=3V, and $V_S$=0V), $I_{ds}$ is maximized by minimizing the transistor length L. Minimizing transistor channel length also improves the speed of integrated circuits comprised of a large number of individual transistors because the larger drain current associated with a short channel length can drive the adjoining transistors into saturation more quickly. Minimizing L is, therefore, desirable from an device operation standpoint. In addition, minimizing the transistor length L is desirable from a manufacturing perspective because a smaller area of silicon is required to manufacture a transistor having a smaller length. By minimizing the area required for a given transistor, the number of transistors available for a given area of silicon increases and, with it, a corresponding increase in the circuit complexity that can be achieved on the given area of silicon.

The main limitation of minimum device size in a conventional transistor fabrication process is the resolution of the optical lithography printing system. In an optical lithography printing system, radiation is directed from an illumination source through a patterned mask and onto a photoresist layer. The patterned mask transmits the illumination source radiation onto selected areas of the photoresist layer to reproduce the mask pattern in the photoresist layer. Resolution in optical lithography systems is limited by diffraction effects, which spread radiation from the illumination source into regions of the photoresist which are not directly exposed to the illumination source. Because of diffraction effects, there is a minimum distance beyond which even a geometrically perfect lens cannot resolve two points. In other words, when two points are less than a minimum distance from each other, the two points cannot be resolved by the lithography system. The diffraction patterns associated with each point overlap each other to such an extent that the two points cannot be effectively differentiated. The resolution of a lens depends on the wavelength of the illumination source and the numerical aperture of the lens. Rayleighs criteria defines two images as being resolvable when the intensity between them drops to 80% of the image intensity. This criteria is satisfied when the 2d=0.61 λ/NA. Where 2d is the separation distance of two images, λ is the wavelength of the energy source, and NA is the numerical aperture of the lens.

Commercially available optical photolithography machines are typically equipped with mercury vapor lamps as the illumination source. The characteristic energy spectrum of a mercury vapor lamp contains several distinct peaks in the 300 nm to 450 nm wavelength range. These peaks are commonly referred to by their industry designations. The peak associated with a wavelength of ~436 nm is designated the "G-line," the ~405 nm peak the "H-line," and the ~370 nm peak the "I-line." Photolithography aligners are similarly designated such that it is common to speak of "G-line aligners." The minimum feature size resolvable by a G-line aligner is greater than the minimum feature size of an I-line aligner because of the longer G-line wavelength.

As process technologies approach and surpass the resolvable limits of G-line and I-line aligners, semiconductor manufacturers are typically forced to implement alternative photolithography techniques to achieve adequate resolution of the minimum features. Unfortunately, the conventional alternatives involve abandoning or substantially modifying the existing photolithography equipment at a prohibitive cost. Many wafer fabrication facilities, for example, have extensive capital investment in G-line aligners. To adequately resolve features in the submicron range, it is typically necessary to upgrade these aligners so that they can operate in the I-line region or abandon the optical alignment equipment entirely and replace it with advanced lithography equipment including e-beam or x-ray lithography.

The cost associated with replacing or upgrading photolithography equipment can be staggering. In addition to the capital required to purchase and install the improved equipment, there are extensive costs associated with qualifying the new equipment for production worthiness and training production and maintenance personnel in the operation and care of the new equipment. Therefore, it is highly desirable to design an MOS transistor and a transistor fabrication process in which the transistor channel length is not limited by the capabilities of the photolithography equipment.

SUMMARY OF THE INVENTION

The problems identified above are in large part addressed by a field effect transistor and a transistor fabrication method in which the source/drain regions of the transistor are vertically displaced from each other. By vertically displacing the source/drain regions of the transistor, the transistor channel length has a vertical component. The dimension of this vertical component of the transistor channel length can be accurately controlled with plasma etch techniques. In this manner, the transistor channel length is not defined by a photolithography process and, therefore, dimensions smaller than the minimum feature size resolvable by a photolithography aligner can be achieved.

Broadly speaking, the present invention contemplates a field effect transistor in which a first source/drain impurity distribution is located within a first source/drain region of a semiconductor substrate. A peak concentration of the first source/drain impurity distribution is located a first depth below an upper surface of the semiconductor substrate. The field effect transistor further includes a second source/drain impurity distribution within a second source/drain region of the semiconductor substrate. A peak concentration of the second source/drain impurity distribution is located at a second depth below the upper surface of the semiconductor substrate. In a presently preferred embodiment, the first depth is greater than the second depth. The field effect transistor further includes a channel region of the semiconductor substrate. The channel region extends from the first source/drain impurity distribution to the second source/drain impurity distribution. The field effect transistor further includes a gate dielectric which is in contact with the channel region and a conductive gate structure in contact with the gate dielectric layer.

In a preferred embodiment, the semiconductor substrate includes a transistor region that is laterally disposed between a first isolation structure and second isolation structure. The substrate further preferably includes a channel trench extending from an upper surface of the semiconductor substrate into a channel trench region of the transistor region of the semiconductor substrate. Preferably, the gate dielectric layer lines the channel trench and the conductive gate structure is suitably located within the channel trench.

The channel trench ideally comprises first and second trench sidewalls. Preferably, the sidewalls are substantially perpendicular to the upper surface of the semiconductor substrate. The channel trench further comprises a trench floor located a trench depth below the upper surface of the semiconductor substrate. In a preferred embodiment, the first trench sidewall forms a lateral boundary of the channel region, the first impurity distribution, and the second impurity distribution. Preferably, the first source/drain region is substantially located below the trench floor within the trench region of the semiconductor substrate. The first depth is preferably approximately equal to the trench depth. The second source/drain region is located exterior to the trench region proximal to the upper surface of the semiconductor substrate. In a presently preferred embodiment, the second depth is approximately equal to 200–400 angstroms.

The first and second source/drain impurity distributions ideally comprise ions of phosphorus or arsenic in an n-channel embodiment and ions of boron in a p-channel embodiment of the transistor. The peak concentration of the first and second source/drain impurity distributions is preferably greater than approximately $10^{19}$ ions/cm$^3$. The gate dielectric layer is suitably comprised of silicon dioxide such as a thermal oxide film. A preferred thickness of the gate dielectric is between approximately 15 and 200 Angstroms. The conductive gate structure is preferably comprised of polysilicon having a sheet resistivity of less than approximately 500 Ω/sq.

The present invention further contemplates a process for forming a field effect transistor. A semiconductor substrate is provided. The substrate includes a first and a second isolation structure. The first and second isolation structure are laterally disposed on either side of a transistor region of the semiconductor substrate. A channel trench is then formed in a channel trench region of the transistor region of the semiconductor substrate. The channel trench includes first and second trench sidewalls and a trench floor. The trench floor is located a trench depth below an upper surface of the semiconductor substrate. A first impurity distribution is then introduced into a first source/drain region of the semiconductor substrate. The first source/drain region is substantially confined to a region below the transistor trench. Preferably, a peak concentration of the first impurity distribution is located at a first depth below the upper surface of the semiconductor substrate. A gate dielectric layer of substantially uniform thickness is then formed on the trench sidewalls and the trench floor. A conductive gate structure is then formed laterally adjacent to, and in contact with, a vertical portion of the gate dielectric layer. Thereafter, a second impurity distribution is introduced into a second source/drain region of the semiconductor substrate. The second source/drain region comprises a portion of the semiconductor substrate exterior to the trench region and proximal to the upper surface of the semiconductor. A peak concentration of the second impurity distribution is located at a second depth below the upper surface of the semiconductor substrate. Preferably, the first depth is greater than the second depth.

The first and second isolation structures, in a presently preferred embodiment, comprise shallow trench isolation dielectric structures. The step of forming the channel trench may suitably include the steps of depositing a sacrificial dielectric layer on the upper surface of the semiconductor substrate, depositing a photoresist layer on the sacrificial dielectric layer, patterning the sacrificial dielectric layer and the photoresist layer to expose an upper surface of the trench region of the semiconductor substrate, and etching the trench region of the semiconductor substrate with an anisotropic chlorinated plasma etch. The deposition of the sacrificial dielectric layer preferably includes chemically vapor depositing oxide formed from a TEOS source.

The step of introducing the first impurity distribution into the semiconductor substrate preferably includes selectively implanting ions of boron, phosphorus, or arsenic into the first source/drain region of the semiconductor substrate. The substantially uniform thickness gate dielectric layer may be formed with a thermal oxidation step including a thermal oxidation within a conventional diffusion tube or a thermal oxidation with a rapid thermal anneal (RTA) process.

The conductive gate structure is preferably formed by depositing a substantially conformal conductive gate layer over the topography of the semiconductor substrate such that the conductive gate layer includes planar regions and vertical regions and anisotropically etching the conformal conductive gate layer to just clear the planar regions of the gate layer. The etching of the conformal conductive gate layer is performed with a minimum overetch such that spacer structures are left on the sidewalls of the transistor trench. The deposition of the conductive gate layer may include the steps of chemically vapor depositing polysilicon at a pressure that is less than approximately 2 torrs and introducing impurities into the polysilicon to reduce the sheet resistivity of the polysilicon to less than approximately 500 Ω/sq.

The second impurity distribution may be introduced into the second source/drain regions through the use of an ion implantation similar to the manner in which the first impurity distribution is introduced into the first source/drain regions. In one embodiment, an implant displacement layer is formed on an upper surface of the semiconductor substrate in an effort to concentrate the second impurity distribution as close to the upper surface of the semiconductor substrate as possible.

BRIEF DESCRIPTION OF THE DRAWINGS

Other objects and advantages of the invention will become apparent upon reading the following detailed description and upon reference to the accompanying drawings in which:

FIGS. 1A and 1B are a partial top plan view and a partial cross-sectional view, respectively, of a semiconductor substrate in which a transistor region is laterally disposed between pair of isolation structures;

FIG. 2B is a processing step subsequent to FIG. 1B in which a dielectric layer and a photoresist layer have been patterned to expose a trench region of the transistor region of the semiconductor substrate;

FIGS. 3A and 3B are processing steps subsequent to FIG. 2B in which a channel trench has been etched into the trench region of the semiconductor substrate and a first impurity distribution introduced into the semiconductor substrate below the channel trench;

FIG. 4B is a processing step subsequent to FIG. 3B in which a gate dielectric layer has been formed on the topography of the semiconductor substrate;

FIG. 5B is a processing step subsequent to FIG. 4B in which a conductive gate layer has been deposited on the gate dielectric layer;

FIGS. 6A1 and 6B are processing steps subsequent to FIG. 5B in which the conductive gate layer has been anisotropically etched with little overetch to produce conductive gate structures;

FIG. 6A2 is an alternative to the embodiment shown in FIG. 6A1 in which the conductive gate structure has been etched to produce isolated first and second conductive gate structures;

FIG. 7B is a processing step subsequent to FIG. 6B in which a second impurity distribution is introduced into a second source/drain region through an implant displacement layer; and FIG. 8 is a partial cross-sectional view of a transistor formed in accordance with the present invention.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents, and alternatives falling within the spirit and scope of the present invention as defined by the appended claims.

DETAILED DESCRIPTION OF THE INVENTION

Turning now to the drawings, FIGS. 1A and 1B show two perspectives of semiconductor substrate 100. The partial cross-sectional view of FIG. 1B shows semiconductor substrate 100, including upper surface 101 of semiconductor substrate 100, and transistor region 104 laterally displaced between first isolation structure 102A and second isolation structure 102B. Semiconductor substrate 100 preferably comprises lightly doped (i.e. having a resistivity of approximately 12 Ω-cm.) n-type or p-type silicon. Transistor region 104 of semiconductor substrate 100 includes the region of substrate 100 wherein a transistor will be formed subsequently. To electrically isolate transistor region 104 from neighboring transistor regions (not shown in the drawing), isolation structures such as first isolation structure 102a and second isolation structure 102b are formed in semiconductor substrate 100. In the embodiment shown in FIG. 1B, isolation structures 102 comprise shallow trench isolation structures. The formation of shallow trench isolation structures such as isolation structures 102 of FIG. 1B is typically accomplished by anisotropically etching a trench shaped void into semiconductor substrate 100, depositing a dielectric such as CVD oxide into the trench shaped void, and removing the dielectric exterior to the trench, preferably with a chemical-mechanical polish possibly in combination with traditional mask and etch processes. It will be appreciated to those skilled in the art of semiconductor processing that isolation structures 102a and 102b may alternatively comprise, for example, LOCOS structures as are well known in the art. LOCOS structures are generally fabricated by oxidizing semiconductor substrate 100 in the presence of an oxidation inhibiting mask such as a patterned silicon nitride layer. LOCOS isolation structures, however, result in a non-planar upper surface 101 of silicon substrate 100 due to the tendency of the oxidation process to extend outward from upper surface 101. In addition, the LOCOS structures include a bird's beak which undesirably encroaches upon transistor region 104 of semiconductor substrate 100. As seen in FIG. 1A, first isolation dielectric 102a and second isolation structure 102b may comprise portions of a common isolation structure 103. In an alternative embodiment (not shown in the drawings) first isolation structure 102a and second isolation structure 102b may be physically separated.

Turning now to FIG. 2B, a composite layer 110 is patterned on upper surface 101 of semiconductor substrate 100. The patterning of composite layer 110 exposes a trench region 112 of semiconductor substrate 100. The patterning of composite layer 110 is preferably achieved by depositing a sacrificial dielectric layer 106, depositing a photoresist layer 108 on an upper surface of sacrificial dielectric layer 106, and selectively removing portions of composite layer 110 through the use of conventional photolithography masking and etching steps. In a presently preferred embodiment, sacrificial dielectric layer 106 comprises a CVD oxide formed from a TEOS source. In an alternative embodiment, not shown, sacrificial dielectric layer 106 may comprise a composite of an oxide layer and a silicon nitride layer.

Turning to FIGS. 3A and 3B, channel trench 114 extends downward to a trench depth $d_t$ below upper surface 101 of semiconductor substrate 100 into trench region 112 of semiconductor substrate 100. The formation of channel trench 114 is preferably accomplished with an anisotropic plasma etch process. In an embodiment in which semiconductor substrate 100 comprises silicon, a chlorinated plasma etch can be suitably used to achieve the desired selectivity with respect to patterned composite layer 100.

The preferred embodiment of the present invention contemplates a transistor in which the channel region extends vertically along the sidewall of a channel trench such as channel trench 114. In such an embodiment, the channel length L of the transistor is approximately equal to the depth $d_t$ of channel trench 114. Because it is possible to etch extremely shallow (i.e., $d_t \leq 0.2$ microns) trenches with good variability control, transistors with extremely short channel lengths (i.e. $\leq 0.2$ microns) can be fabricated. The vertical orientation of the channel in the preferred embodiment removes the minimum channel length constraints typically found in conventional semiconductor transistors in which the channel length is oriented substantially parallel to upper surface 101 and is defined by a photolithography process.

Subsequent to the formation of channel trench 114 and prior to removing patterned composite layer 110, a first source/drain impurity distribution 122 is introduced into first source/drain region 123 of semiconductor substrate 100 preferably through the use of a first ion implantation 120. It will be understood to those skilled in the art that the present invention is capable of producing both n-channel and p-channel transistors. In an n-channel embodiment, ion implantation 120 preferably comprises the implantation of arsenic or, less suitably, phosphorus. By performing ion implantation 120 with pattern composite layer 110 still in place, the first source/drain impurity distribution 122 can be substantially confined to a region of semiconductor substrate 100 below channel trench 114. As with any ion implantation process, however, a small amount of lateral diffusion or "straggle" will occur such that first source/drain impurity region 122 will extend laterally slightly beyond isolation region 112 defined by sidewalls 116 of isolation trench 114. In a p-channel embodiment, ion implantation 120 will preferably comprise the implantation of boron ions into first source/drain region 123 of semiconductor substrate 100. In both the n-channel and p-channel embodiments, the peak concentration value of first source/drain impurity distribution exceeds approximately $10^{19}$ atoms/cm$^3$.

Turning to FIG. 4B, patterned composite layer 110 is removed and gate dielectric layer 124 is formed on topography 125 of semiconductor substrate 100 cooperatively defined by upper surface 101 of semiconductor substrate 100, sidewalls 116a and 116b of channel trench 114, and trench floor 118 of channel trench 114 such that gate dielectric layer 124 lines the interior of channel trench 114. The formation of gate dielectric layer 124 is preferably achieved by a thermal oxidation process such that gate dielectric layer 124 comprises silicon dioxide. In alternative embodiments, the formation of gate dielectric layer 124 may be performed in a thermal oxidation furnace using temperatures of approximately 700°–900° C. or, alternatively, in a rapid thermal anneal apparatus in which semiconductor substrate 100 is subjected to a temperature of approximately 700°–1000° C. for a relatively short (i.e., less than 20 minutes) duration. A thickness of gate dielectric layer 124 is preferably between 15 and 200 angstroms.

Turning now to FIG. 5, a conductive gate layer 126 is deposited on topography 125. The deposition of conductive gate layer 126 is preferably performed under conditions conducive to producing a substantially conformal film. In one embodiment, a low pressure (i.e., less than approximately 2 torrs) chemical vapor deposition process is used to deposit a layer of amorphous polysilicon. The substantially conformal conductive gate layer 126 includes planar regions 127a and 127b. In an embodiment in which conformal gate layer 126 comprises polysilicon, the sheet resistivity of conductive gate layer 126 is preferably reduced by introducing impurities into conductive gate layer 126. The introduction of impurities into conductive gate layer 126 can be accomplished either in situ during deposition, or post-deposition in a diffusion tube or with a ion implantation process. In an embodiment in which it is desired to produce n-channel transistors, phosphorus or arsenic impurities are preferably introduced into conductive gate layer 126 while, in a p-channel embodiment, a boron impurity is preferably used. In either embodiment, it is preferable to introduce sufficient impurities to reduce the sheet resistivity of conformal gate layer 126 such that its sheet resistivity is less than approximately 500 Ω/sq.

In FIG. 6B, conformal gate layer 126 has been etched to produce first and second conductive gate structures 128a and 128b, respectively. As will be appreciated to those skilled in the art, conductive gate structures 128 comprise spacer structures. Spacer structures are produced by anisotropically etching a conformal thin film layer such as conductive gate layer 126 shown in FIG. 5B. Conformal gate layer 126 is anisotropically etched, preferably using a plasma etch process, until gate layer 126 is just cleared in planar regions 127a and 127b. The etch process is performed with a minimum overetch (i.e., the duration of the overetch is less than 10% of the duration of the main etch process). By using an anisotropic etch and minimizing the overetch, spacer structures such as first and second conductive gate structures 128a and 128b are formed on sidewalls 116 of channel trench 114 and are substantially contained within channel trench 114. FIG. 6A1 shows a partial top view of semiconductor substrate 100 in which first and second conductive gate structures 128a and 128b comprise portions of a single continuous gate structure 129. In this embodiment, a single transistor gate is formed. Alternatively, FIG. 6A2 shows an embodiment in which first conductive gate structure 128a and second conductive gate structure 128b are discontinuous. In this embodiment, a pair of transistors sharing a single source/drain region can be produced. Isolated conductive gate structures such as shown on FIG. 6A2 can be produced by performing a conventional mask and etch process on the conductive gate structure 129 shown in FIG. 6A1.

In FIG. 7B, an implant displacement layer 130 is deposited on semiconductor substrate 100 thereby covering gate dielectric layer 124 and conductive gate structures 128a and 128b. Implant displacement layer 130 suitably comprises a dielectric material such as a TEOS CVD oxide. Subsequent to the deposition of implant displacement layer 130, second impurity distribution 134a and 134b are introduced into second source/drain regions 135a and 135b, preferably through the use of second ion implantation 132. Second source/drain regions 135 are exterior to channel trench region 112 of semiconductor substrate 100 and are proximal to upper surface 101 of substrate 100. As seen more clearly in FIG. 8, a peak concentration of second source/drain impurity distribution 134 is located at a depth $d_2$ below upper surface 101 of semiconductor substrate 100. The use of implant displacement layer 130 facilitates the production of a impurity concentration in which the peak concentration is located at or near upper surface 101 of semiconductor substrate 100. It is desirable to minimize the second depth $d_2$ so that the amount of impurity distribution 134 introduced into channel region 130a of transistor 136 is minimized. In a presently preferred embodiment, second depth $d_2$ is approximately 200 to 400 angstroms. It is to be understood, however, that the use of implant displacement layer 130 is optional. In an embodiment not shown in the drawings, for example, the second depth $d_2$ may be minimized by reducing the energy at which second ion implantation 132 is performed.

It will be appreciated to those skilled in the art that FIG. 8 discloses a field effect transistor 136. Transistor 136 includes a first source/drain impurity distribution 122 located in a first source/drain impurity distribution region 123 of semiconductor substrate 100. A peak concentration of first source/drain impurity distribution 122 is located at a first depth $d_1$ below upper surface 101 of semiconductor substrate 100. Transistor 136 further includes a second source/drain impurity distribution 134 located in a second source/drain impurity distribution region 135 of semiconductor substrate 100. A peak concentration of second source/drain impurity distribution 134 is located at a second depth $d_2$ below upper surface 101 of semiconductor substrate 100. First depth $d_1$ is greater than second depth $d_2$ such that a vertical displacement L exists between first source/drain impurity distribution 122 and second source/drain impurity distribution 134. A channel region 138 of transistor 136 extends from first source/drain impurity distribution 122 to second source/drain impurity distribution 134. A gate dielectric 124 in contact with channel region 138 of transistor 136 and a conductive gate structure 128 in contact with gate dielectric 124 are also included in transistor 136. In an n-channel embodiment of transistor 136 first source/drain impurity distribution 122 and second source/drain impurity distribution 134 comprise a concentration of phosphorus or arsenic ions while in a p-channel embodiment, the respective source/drain impurity distributions comprise ions of boron. Application of an appropriate voltage to conductive gate structure 128 induces a channel in channel region 138 thus forming a conductive path from first source/drain region 123 to second source/drain region 134. Contacts to the nodes of transistor 136 can be appropriately formed through subsequent processing steps so that the individual nodes of transistor 136 can be selectively coupled to other similarly formed transistors within semiconductor substrate 100 to produce an integrated circuit. Because channel region 138 in the preferred embodiment is substantially vertical and is defined by the depth of channel trench 134, the channel length L of transistor 136 is controlled by an etch process rather than by a photolithography process. Because it is possible to etch extremely shallow (i.e., less than 0.2 microns) trenches, the process of the present invention is capable of producing transistors 136 with channel lengths L less than channel length of MOS transistors formed with conventional photolithography techniques in which the channel region is substantially parallel to the upper surface of the semiconductor substrate.

It will be appreciated to those skilled in the art having the benefit of this disclosure that this invention is capable of forming a transistor having an effective channel length that is shorter than the minimum feature size resolvable by a photolithography exposure device. Furthermore, it is to be understood that the form of the invention shown and described is to be taken as presently preferred embodiments. Various modifications and changes may be made to each and every processing step as would be obvious to a person skilled in the art having the benefit of this disclosure. It is intended that the following claims be interpreted to embrace all such modifications and changes and, accordingly, the specification and drawings are to be regarded in an illustrative rather than a restrictive sense.

What is claimed is:

1. A process of forming a transistor comprising:

providing a semiconductor substrate, wherein said substrate comprises a first and a second isolation structure laterally disposed on either side of a transistor region of said semiconductor substrate;

forming a channel trench in a channel trench region of said transistor region of semiconductor substrate, said channel trench comprising first and second trench sidewalls and a trench floor located a trench depth below an upper surface of said semiconductor substrate;

introducing a first impurity distribution into a first source/drain region of said semiconductor substrate, wherein said first source/drain region comprises a portion of said semiconductor substrate below said transistor trench, and further wherein a peak concentration of said first impurity distribution is located at a first depth below said upper surface of said semiconductor substrate;

forming a substantially uniform thickness gate dielectric layer on said trench sidewalls and said trench floor;

forming a conductive gate structure laterally adjacent to and in contact with a vertical portion of said gate dielectric layer said; and introducing a second impurity distribution into a second source/drain region of said semiconductor substrate, wherein said second source/drain region comprises a portion of said semiconductor substrate exterior to said trench region and proximal to said upper surface of said semiconductor such that a peak concentration of said second impurity distribution is located at a second depth below said upper surface of said semiconductor substrate and wherein said first depth is greater than said second depth.

2. The process of claim 1 wherein said first and second isolation structures comprise shallow trench isolation dielectric structures.

3. The process of claim 1, wherein the step of forming said channel trench comprises:

depositing a sacrificial dielectric layer on said upper surface of said semiconductor substrate;

depositing a photoresist layer on said sacrificial dielectric layer;

patterning said sacrificial dielectric layer and said photoresist layer such that an upper surface of said trench region of said semiconductor substrate is exposed; and anisotropically etching said trench region of said semiconductor substrate with a chlorinated plasma.

4. The process of claim 3 wherein the step of depositing said sacrificial dielectric layer comprises chemically vapor depositing oxide formed from a TEOS source.

5. The process of claim 1 wherein the step of introducing said first impurity distribution comprises selectively implanting ions selected from the group consisting of phosphorous, arsenic, or boron into said first source/drain region of said semiconductor substrate.

6. The process of claim 1 wherein the step of forming said substantially uniform thickness gate dielectric layer comprises thermally oxidizing said semiconductor substrate.

7. The process of claim 1 wherein the step of forming said conductive gate structure comprises:

depositing a substantially conformal conductive gate layer over a topography of said semiconductor substrate, such that said conductive gate layer comprises planar regions and vertical regions; and anisotropically etching said conformal conductive gate layer to clear said planar regions of said gate layer with minimum overetch.

8. The process of claim 7 wherein the step of depositing said conductive gate layer comprises:

chemically vapor depositing polysilicon at a pressure less than approximately 2 torrs; and introducing impurities into said polysilicon such that a sheet resistivity of said polysilicon is less than approximately 500 Ω/sq.

9. The process of claim 1 wherein the step of introducing said second source/drain region comprises implanting ions selected from the group consisting of boron, phosphorous, and arsenic into said second source/drain region of said semiconductor substrate.

10. The process of claim 1, further comprising, prior to the step of introducing said second impurity distribution, depositing an implant displacement layer on an upper surface of said semiconductor substrate.

* * * * *